(12) United States Patent
Kinomura et al.

(10) Patent No.: US 11,715,957 B2
(45) Date of Patent: Aug. 1, 2023

(54) POWER AMOUNT MEASUREMENT SYSTEM, POWER AMOUNT MEASUREMENT METHOD, AND POWER AMOUNT MEASUREMENT DEVICE

(71) Applicant: Toyota Jidosha Kabushiki Kaisha, Toyota (JP)

(72) Inventors: Shigeki Kinomura, Toyota (JP); Hironobu Kitaoka, Nisshin (JP); Toru Nakamura, Toyota (JP); Hidetoshi Kusumi, Nagoya (JP); Yoshiyuki Tsuchiya, Hamamatsu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 240 days.

(21) Appl. No.: 17/165,409

(22) Filed: Feb. 2, 2021

(65) Prior Publication Data

US 2021/0242683 A1    Aug. 5, 2021

(30) Foreign Application Priority Data

Feb. 4, 2020  (JP) .................................. 2020-016955

(51) Int. Cl.
*H02J 3/32* (2006.01)
*H02J 13/00* (2006.01)
(Continued)

(52) U.S. Cl.
CPC .......... *H02J 3/322* (2020.01); *G01R 19/2513* (2013.01); *G01R 22/063* (2013.01);
(Continued)

(58) Field of Classification Search
CPC ................. H02J 3/322; H02J 13/00002; H02J 13/00026; H02J 13/00034; H02J 2310/10;
(Continued)

(56) References Cited

U.S. PATENT DOCUMENTS

2012/0278215 A1* 11/2012 Baek ................... H02J 7/00047
702/62
2013/0264865 A1* 10/2013 Sugeno ................... H02J 3/322
307/19
(Continued)

FOREIGN PATENT DOCUMENTS

JP   2014068439 A  *  4/2014
JP   2015-162986 A     9/2015
(Continued)

*Primary Examiner* — Mohammad Ali
*Assistant Examiner* — Dhruvkumar Patel
(74) *Attorney, Agent, or Firm* — Dinsmore & Shohl LLP

(57) ABSTRACT

When a baseline is in a certain state, a server executes a process including: a step of calculating an amount of power exchanged between a battery and a power grid during the first charging control; a step of calculating an amount of power exchanged between the battery and the power grid during the second charging control; a step of calculating an amount of power exchanged between the battery and the power grid during the first power feeding control; a step of calculating an amount of power exchanged between the battery and the power grid during the second power feeding control; and a step of setting a calibration line for the amount of power.

9 Claims, 5 Drawing Sheets

(51) Int. Cl.
  *G01R 19/25* (2006.01)
  *G01R 22/06* (2006.01)
  *G05F 1/66* (2006.01)
  *G06Q 50/06* (2012.01)
  *H02J 7/00* (2006.01)

(52) U.S. Cl.
  CPC .............. *G05F 1/66* (2013.01); *G06Q 50/06* (2013.01); *H02J 7/007* (2013.01); *H02J 13/00002* (2020.01); *H02J 13/00026* (2020.01); *H02J 13/00034* (2020.01); *H02J 2310/10* (2020.01)

(58) Field of Classification Search
  CPC . H02J 7/0047; G01R 19/2513; G01R 22/063; G01R 21/00; G01R 22/06; G05F 1/66; Y02E 60/00; Y02T 10/70; Y02T 10/7072; Y02T 90/12; Y02T 90/16; Y02T 90/167; Y04S 30/12; Y04S 40/126; B60L 53/66; B60L 53/68
  See application file for complete search history.

(56) References Cited

U.S. PATENT DOCUMENTS

| | | | | |
|---|---|---|---|---|
| 2014/0025218 | A1* | 1/2014 | Nishi | H02J 13/00016 |
| | | | | 700/295 |
| 2015/0241896 | A1* | 8/2015 | Nishibayashi | G05B 15/02 |
| | | | | 700/286 |
| 2017/0207632 | A1* | 7/2017 | Endo | H02J 13/00001 |
| 2017/0302077 | A1* | 10/2017 | Yabe | G06Q 30/04 |
| 2018/0205230 | A1* | 7/2018 | Kudo | H02J 3/322 |
| 2020/0006954 | A1* | 1/2020 | Miyata | H02J 3/322 |

FOREIGN PATENT DOCUMENTS

| | | |
|---|---|---|
| JP | 2018-148679 A | 9/2018 |
| JP | 2019-050667 A | 3/2019 |

* cited by examiner

POWER AMOUNT MEASUREMENT SYSTEM, POWER AMOUNT MEASUREMENT METHOD, AND POWER AMOUNT MEASUREMENT DEVICE

CROSS REFERENCE TO RELATED APPLICATIONS

This nonprovisional application is based on Japanese Patent Application No. 2020-016955 filed on Feb. 4, 2020, with the Japan Patent Office, the entire contents of which are hereby incorporated by reference.

BACKGROUND

Field

The present disclosure relates to a technique for measuring an amount of power exchanged between a power grid and a power storage device.

Description of the Background Art

There has been known a technique for leveling out a power demand in a power grid by exchanging power between the power grid and a power storage device mounted on an electrically powered vehicle, a power storage device installed in a house, or the like so as to change an amount of demanded power. A user participating in leveling out the power demand makes a deal with a business entity that manages the power demand so as to have an incentive corresponding to an amount of power exchanged with the power grid. The amount of power exchanged between the power storage device and the power grid is measured using, for example, a smart meter or the like.

Japanese Patent Laying-Open No. 2019-050667 discloses a technique for measuring respective amounts of charging power and respective amounts of discharging power of a power storage device and a power generation device using smart meters respectively provided in the power storage device and the power generation device, and calculating, based on a measurement result, an amount of power to be sold.

SUMMARY

However, in the case where smart meters are provided for respective configurations, such as a power storage device and a power generation device, that each exchange power, cost is increased by providing the plurality of smart meters. In the case where a plurality of smart meters are installed in accordance with a plurality of contracts, a measurement result may not be obtained from a smart meter due to a restriction in a contract or the like. Further, in the case where an amount of power exchanged between a power grid and a power storage device or the like is detected using a smart meter provided between the power grid and a connection target of the power grid such as a house, the detected amount of power also includes an amount of power exchanged between the power grid and each of a plurality of electrical devices other than the power storage device. Therefore, only an amount of power exchanged between the power storage device and the power grid may be unable to be measured precisely.

An object of the present disclosure is to provide a power amount measurement system, a power amount measurement method, and a power amount measurement device to precisely measure an amount of power exchanged between a power storage device and a power grid.

A power amount measurement system according to an aspect of the present disclosure includes: a smart meter that measures an amount of power exchanged between a power grid and a connection target of the power grid; a power storage device that is one of a plurality of electrical devices included in the connection target; a power conversion device that adjusts power to be exchanged between the power grid and the power storage device; and a server that obtains a measurement result of the smart meter and that controls the power conversion device. When a baseline indicating power consumption of an electrical device is in a certain state, the server instructs the power conversion device to execute first control to control the power conversion device to exchange power with a first amount of power being employed as an instruction value, the electrical device being other than the power storage device and included in the connection target. The server obtains, from the smart meter, a first measurement result about an amount of power exchanged during an execution period of the first control. When the baseline is in the certain state, the server instructs the power conversion device to execute second control to control the power conversion device to exchange power with a second amount of power being employed as the instruction value, the second amount of power being different from the first amount of power. The server obtains, from the smart meter, a second measurement result about an amount of power exchanged during an execution period of the second control. The server determines, using the first measurement result and the second measurement result, a relation between the instruction value and a measurement value of the amount of power exchanged between the power grid and the power storage device.

In this way, the relation between the instruction value for the power conversion device and the measurement value of the amount of power exchanged between the power grid and the power storage device is obtained based on the first measurement result and the second measurement result. Hence, the amount of power exchanged between the power grid and the power storage device can be measured precisely without newly adding a measurement device such as a smart meter.

In an embodiment, the server sets, using the first measurement result and the second measurement result, a calibration line indicating the relation between the instruction value and the measurement value.

In this way, the calibration line indicating the relation between the measurement value and the instruction value is set based on the first measurement result and the second measurement result. Hence, the amount of power exchanged between the power grid and the power storage device can be measured precisely without newly adding a measurement device such as a smart meter.

Further, in an embodiment, when the baseline is brought out of the certain state during execution of at least one of the first control and the second control, the server does not set the calibration line using the first measurement result and the second measurement result.

In this way, a calibration line with low precision can be suppressed from being set as the calibration line indicating the relation between the instruction value for the power conversion device and the amount of power exchanged between the power grid and the power storage device.

Further, in an embodiment, by instructing the power conversion device to execute the first control and the second control multiple times, the server obtains a plurality of measurement results about the amount of power exchanged during the execution period of the first control and the amount of power exchanged during the execution period of the second control.

In this way, the relation between the measurement value and the instruction value can be obtained precisely using the plurality of measurement results.

Further, in an embodiment, the server obtains each of the first measurement result and the second measurement result using a third measurement result of the plurality of measurement results, the third measurement result indicating that a difference between the instruction value and the measurement value is less than or equal to a threshold value.

In this way, since the first measurement result and the second measurement result are obtained using the measurement result, for which the difference between the instruction value and the measurement value is less than or equal to the threshold value, of the plurality of detection results, the relation between the measurement value and the instruction value can be obtained precisely.

A power amount measurement method according to another aspect of the present disclosure is a power amount measurement method employing a smart meter that measures an amount of power exchanged between a power grid and a connection target of the power grid, a power storage device that is one of a plurality of electrical devices included in the connection target, and a power conversion device that adjusts power to be exchanged between the power grid and the power storage device. The power amount measurement method includes: when a baseline indicating power consumption of an electrical device is in a certain state, executing first control to control the power conversion device to exchange power with a first amount of power being employed as an instruction value, the electrical device being other than the power storage device and included in the connection target; obtaining, from the smart meter, a first measurement result about an amount of power exchanged during an execution period of the first control; when the baseline is in the certain state, executing second control to control the power conversion device to exchange power with a second amount of power being employed as the instruction value, the second amount of power being different from the first amount of power; obtaining, from the smart meter, a second measurement result about an amount of power exchanged during an execution period of the second control; and determining, using the first measurement result and the second measurement result, a relation between the instruction value and a measurement value of the amount of power exchanged between the power grid and the power storage device.

A power amount measurement device according to still another aspect of the present disclosure is a power amount measurement device for obtaining a measurement result of a smart meter that measures an amount of power exchanged between a power grid and a connection target of the power grid and for providing an execution instruction for predetermined control to a power conversion device that adjusts power to be exchanged between the power grid and a power storage device, the power storage device being one of a plurality of electrical devices included in the connection target. When a baseline indicating power consumption of an electrical device is in a certain state, the power amount measurement device instructs the power conversion device to execute first control to control the power conversion device to exchange power with a first amount of power being employed as an instruction value, the electrical device being other than the power storage device and included in the connection target. The power amount measurement device obtains, from the smart meter, a first measurement result about an amount of power exchanged during an execution period of the first control. When the baseline is in the certain state, the power amount measurement device instructs the power conversion device to execute second control to control the power conversion device to exchange power with a second amount of power being employed as the instruction value, the second amount of power being different from the first amount of power. The power amount measurement device obtains, from the smart meter, a second measurement result about an amount of power exchanged during an execution period of the second control. The power amount measurement device determines, using the first measurement result and the second measurement result, a relation between the instruction value and a measurement value of the amount of power exchanged between the power grid and the power storage device.

A power amount measurement device according to yet another aspect of the present disclosure is a power amount measurement device for communicating with a server that obtains a measurement result of a smart meter that measures an amount of power exchanged between a power grid and a connection target of the power grid. The power amount measurement device includes: a power storage device that is one of a plurality of electrical devices included in the connection target; a power conversion device that adjusts power to be exchanged between the power storage device and the power grid; and a controller that controls the power conversion device. When a baseline indicating power consumption of an electrical device is in a certain state and the controller receives, from the server, an execution instruction for first control to control the power conversion device to exchange power with a first amount of power being employed as an instruction value, the controller executes the first control, the electrical device being other than the power storage device and included in the connection target. The controller obtains, from the server, a first measurement result about an amount of power exchanged during an execution period of the first control. When the baseline is in the certain state and the controller receives, from the server, an execution instruction for second control to control the power conversion device to exchange power with a second amount of power being employed as the instruction value, the controller executes the second control, the second amount of power being different from the first amount of power. The controller obtains, from the server, a second measurement result about an amount of power exchanged during an execution period of the second control. The controller determines, using the first measurement result and the second measurement result, a relation between the instruction value and the amount of power exchanged between the power grid and the power storage device. The controller calculates, using the relation and the instruction value, a measurement value of the amount of power exchanged between the power grid and the power storage device.

A power amount measurement device according to still another aspect of the present disclosure is a power amount measurement device for communicating with a server that provides an execution instruction for predetermined control to a power conversion device that adjusts power to be exchanged between a power storage device and a power grid, the power storage device being one of a plurality of electrical devices included in a connection target of the power grid. The power amount measurement device includes: a measurement device that measures an amount of power exchanged between the power grid and the connection target; and a calculation device that calculates a measurement value of an amount of power exchanged between the power grid and the power storage device. When a baseline indicating power consumption of an electrical device other than the power storage device and included in the connection target is in a certain state, the server instructs the power conversion device to execute first control to control the power conversion device to exchange power with a first amount of power being employed as an instruction value and instructs the power conversion device to execute second control to control the power conversion device to exchange power with a second amount of power being employed as the instruction value, the second amount of power being different from the first amount of power. The calculation device determines, using a first measurement result and a second measurement result, a relation between the instruction value and the measurement value of the amount of power exchanged between the power grid and the power storage device, the first measurement result being a measurement result about an amount of power exchanged during an execution period of the first control, the second measurement result being a measurement result about an amount of power exchanged during an execution period of the second control, the first measurement result and the second measurement result being provided by the measurement device. The calculation device calculates, using the relation and the instruction value, a measurement value of power exchanged between the power grid and the power storage device.

The foregoing and other objects, features, aspects and advantages of the present disclosure will become more apparent from the following detailed description of the present disclosure when taken in conjunction with the accompanying drawings.

DETAILED DESCRIPTION

Figure 1:
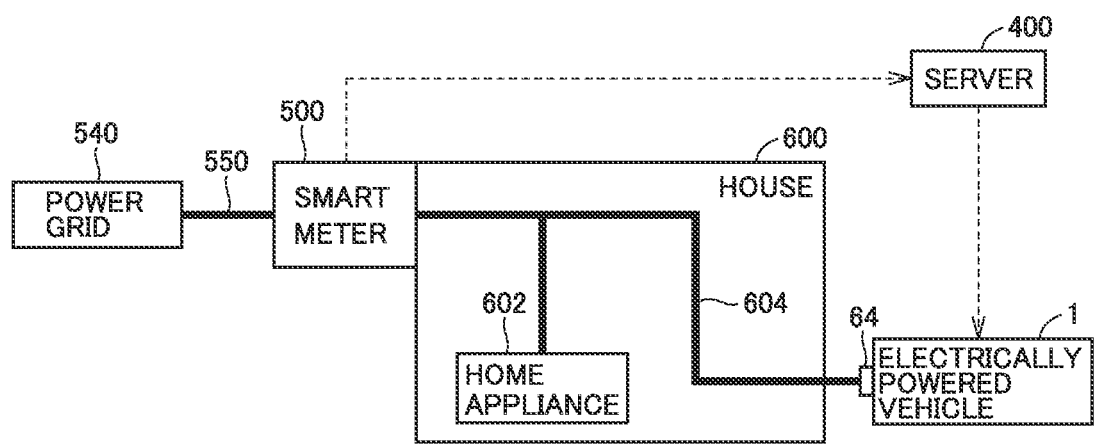
FIG. 1 is a diagram showing an exemplary configuration of a power system in the present embodiment.

Hereinafter, embodiments of the present disclosure will be described in detail with reference to figures. It should be noted that the same or corresponding portions in the figures are denoted by the same reference characters and will not be described repeatedly.

FIG. 1 is a diagram showing an exemplary configuration of a power system in the present embodiment. As shown in FIG. 1, the power system includes an electrically powered vehicle 1, a server 400, a smart meter 500, a power grid 540, a power line 550, and a house 600.

Electrically powered vehicle 1 is an electric vehicle including a battery 100 (see FIG. 2) that stores power for traveling. A connector 64, which is connected to house 600, is attachable to electrically powered vehicle 1. Electrically powered vehicle 1 can exchange power with house 600 via connector 64.

For example, power grid 540 is a power system constructed of: a power generation station including a power generation device for generating electric power; and a power transmission/distribution facility including a power transmission line, a substation, a distribution line, and the like. Power grid 540 is connected to house 600, which serves as a connection target of power grid 540, via power line 550.

House 600 includes a home appliance 602 and an in-house power line 604. Home appliance 602 is an electrical device installed in house 600, and is operated using power supplied via in-house power line 604. In-house power line 604 connects home appliance 602 in house 600, electrically powered vehicle 1 parked in a parking space of house 600, and power line 550 to one another. In-house power line 604 is appropriately provided with a distribution board (not shown) or the like.

Smart meter 500 is provided between power line 550 and in-house power line 604 of house 600. Whenever a predetermined measurement period (for example, 30 minutes) elapses, smart meter 500 measures an amount of power exchanged between power grid 540 and house 600 in the measurement period, for example. Smart meter 500 transmits, to server 400, information about a measurement value of the amount of power.

Server 400 can communicate with each of electrically powered vehicle 1 and smart meter 500. Server 400 receives the information about the measurement value of the amount of power from smart meter 500. Further, server 400 can instruct electrically powered vehicle 1 to execute at least one of: charging of battery 100; feeding of power from battery 100; halt of the charging; and halt of the feeding of power.

In this power system, power can be exchanged between power grid 540 and house 600. Since electrically powered vehicle 1 having battery 100 mounted thereon is connected to house 600, power can be exchanged between power grid 540 and battery 100 mounted on electrically powered vehicle 1. An amount of power exchanged between power grid 540 and house 600 is measured by smart meter 500. A measurement value of the amount of power is transmitted from smart meter 500 to server 400, and is stored into server 400.

Figure 2:
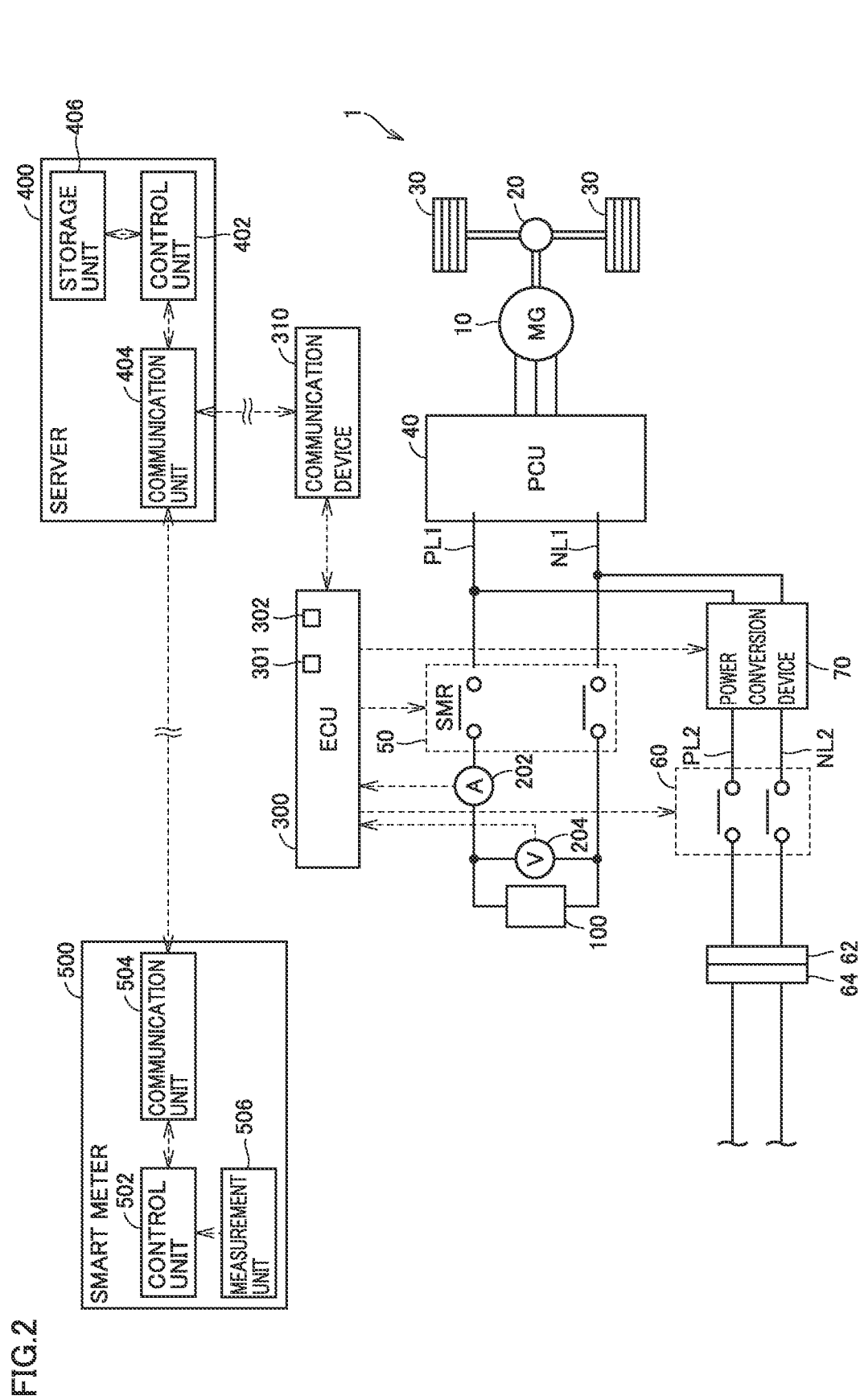
FIG. 2 is a diagram showing an exemplary configuration of a power amount measurement system according to the present embodiment.

Hereinafter, each configuration of a power amount measurement system will be described in detail with reference to FIG. 2. FIG. 2 is a diagram showing an exemplary configuration of the power amount measurement system according to the present embodiment.

In the present embodiment, the power amount measurement system is constituted of electrically powered vehicle 1 (more specifically, a power conversion device 70 and battery 100), server 400, and smart meter 500.

Electrically powered vehicle 1 includes a motor generator (MG) 10, a power transmission gear 20, driving wheels 30, a power control unit (PCU) 40, a system main relay (SMR) 50, a charging/discharging relay 60, a power conversion device 70, an inlet 62, battery 100, an electronic control unit (ECU) 300, and a communication device 310.

MG 10 is, for example, a three-phase AC rotating electrical machine, and has a function as an electric motor (motor) and a function as a power generator (generator). Output torque of MG 10 is transmitted to driving wheels 30 via power transmission gear 20 including a reduction gear, a differential gear, and the like. It should be noted that FIG. 1 shows a configuration in which only one MG is provided; however, the number of MGs is not limited thereto. A plurality of MGs (for example, two MGs) may be provided.

PCU 40 is a power conversion device for bi-directionally converting power between MG 10 and battery 100. PCU 40 includes, for example, an inverter and a converter (each not shown), each of which is operated based on a control signal from ECU 300. It should be noted that PCU 40 may include no converter.

SMR 50 is electrically connected to power supply lines PL1, NL1 that connect battery 100 to PCU 40. SMR 50 is operated in accordance with a control signal from ECU 300, for example.

For example, when SMR 50 is closed (i.e., is in an electrically conductive state) in accordance with a control signal from ECU 300, power can be exchanged between battery 100 and PCU 40. On the other hand, when SMR 50 is opened (i.e., in a disconnection state) in accordance with a control signal from ECU 300, the electrical connection between battery 100 and PCU 40 is disconnected.

Battery 100 is a rechargeable DC power supply, and is, for example, a secondary battery such as a nickel-metal hydride battery or a lithium ion battery including a solid or liquid electrolyte. It should be noted that battery 100 is an exemplary power storage device that stores power, and is not limited to such a secondary battery. For example, a capacitor or the like may be used as the DC power supply instead of battery 100.

One end of power supply line PL2 is connected to power supply line PL1 at a position between SMR 50 and PCU 40. One end of power supply line NL2 is connected to power supply line NL1 at a position between SMR 50 and PCU 40. Each of the other ends of power supply lines PL2, NL2 is connected to inlet 62. Charging/discharging relay 60 and power conversion device 70 are provided between one end of each of power supply lines PL2, NL2 and the other end of each of power supply lines PL2, NL2.

Connector 64 is attachable to inlet 62. Inlet 62 has a structure that allows connector 64 to be attached thereto and detached therefrom.

Charging/discharging relay 60 can switch from one of a connection state (close state) and a disconnection state (open state) between inlet 62 and power conversion device 70 to the other state. Charging/discharging relay 60 is operated, for example, in accordance with a control signal from ECU 300.

For example, when charging/discharging relay 60 is closed (i.e., in the electrically conductive state) in accordance with a control signal from ECU 300, power can be exchanged between inlet 62 and power conversion device 70. On this occasion, when SMR 50 is in the electrically conductive state, power conversion device 70 is operated to bring electrically powered vehicle 1 into a state in which charging power can be supplied from inlet 62 to battery 100 (i.e., a state in which charging control can be executed) or into a state in which feeding power can be supplied from battery 100 to inlet 62 (i.e., a state in which power feeding control can be executed).

On the other hand, when charging/discharging relay 60 is opened (i.e., in the disconnection state) in accordance with a control signal from ECU 300, the electrical connection between inlet 62 and power conversion device 70 is disconnected. On this occasion, electrically powered vehicle 1 is brought into a state in which charging power cannot be supplied from power grid 540 to battery 100 via inlet 62.

ECU 300 includes a CPU (Central Processing Unit) 301 and a memory 302 (including a ROM (Read Only Memory), a RAM (Random Access Memory), or the like, for example). ECU 300 controls each of devices to bring electrically powered vehicle 1 into a desired state based on signals from various types of sensors and information such as maps and programs stored in memory 302. Various types of control performed by ECU 300 are not limited to processes by software and can be processes by dedicated hardware (electronic circuit).

A current sensor 202 and a voltage sensor 204 are connected to ECU 300. Current sensor 202 detects current IB flowing through battery 100. Voltage sensor 204 detects voltage VB between the terminals of battery 100. Current sensor 202 and voltage sensor 204 transmit signals indicating respective detection results to ECU 300.

Server 400 manages battery 100 of electrically powered vehicle 1 owned by a user as one of energy resources. For example, server 400 levels out a power demand by charging or discharging battery 100 mounted on electrically powered vehicle 1 and an energy resource owned by another user (for example, a battery of an electrically powered vehicle, a power storage device installed in a building, or the like) so as to change an amount of demanded power in power grid 540. It should be noted that a user participating in leveling out a power demand makes a deal with a business entity that manages the power demand (i.e., business entity that manages server 400) to have an incentive corresponding to an amount of power exchanged between the power grid and the energy resource. Therefore, server 400 is required to obtain an amount of power exchanged between battery 100 and power grid 540.

As shown in FIG. 2, server 400 includes a control unit 402, a communication unit 404, and a storage unit 406.

Control unit 402 includes a CPU (not shown) and the like, and executes a predetermined calculation process based on information stored in storage unit 406, information received from electrically powered vehicle 1 via communication unit 404, information received from smart meter 500 via communication unit 404, or the like.

Communication unit 404 can communicate with, for example, each of communication device 310 of electrically powered vehicle 1 and a communication unit 504 of smart meter 500. Communication unit 404 and communication device 310 exchange information therebetween through predetermined wireless communication. It should be noted that the predetermined wireless communication includes, for example, wireless communication that complies with a wireless communication method using a wireless communication standard such as a wireless LAN (Local Area Network) or 3G, 4G, or 5G for mobile phones.

Storage unit 406 includes, for example, a memory such as a ROM or a RAM, and a large-capacity storage device such as a hard disk or a solid state drive. Storage unit 406 stores, for example, a history of communication with communication unit 504 (for example, a history of an amount of power measured by smart meter 500, or the like) and a history of communication with communication device 310 (for example, a history of an instruction to power conversion device 70 mounted on electrically powered vehicle 1, or the like).

As described above, smart meter 500 measures an amount of power exchanged between house 600 and power grid 540 during a measurement period, and transmits information about a measurement value of the amount of power to server 400. It should be noted that the amount of power exchanged between house 600 and power grid 540 includes an amount of power supplied from power grid 540 to house 600 and an amount of power supplied from house 600 to power grid 540.

Smart meter 500 has, for example, unique identification information. Smart meter 500 transmits the unique identification information to server 400 together with the information about the measurement value of the amount of power. Server 400 stores, into storage unit 406, the unique identification information and the information about the measurement value of the amount of power in association with each other. Server 400 uses the unique identification information to specify the user, specify electrically powered vehicle 1, specify smart meter 500, or specify house 600. When server 400 receives respective pieces of information about measurement values of amounts of power from a plurality of smart meters, server 400 stores the pieces of information into storage unit 406 in a distinguishable manner for each smart meter.

Smart meter 500 includes, for example, a control unit 502, a communication unit 504, and a measurement unit 506.

Control unit 502 includes a CPU (not shown) and the like, and executes a predetermined calculation process based on measurement information measured by measurement unit 506, information received from server 400 via communication unit 504, or the like.

Measurement unit 506 includes, for example, a voltage sensor (not shown) that detects voltage in power line 550 and a current sensor (not shown) that detects current flowing through power line 550. Measurement unit 506 transmits indications of voltage and current to control unit 502 as measurement information at a predetermined time interval (for example, about several seconds to several minutes).

Communication unit 504 can communicate with communication unit 404 of server 400. Information is exchanged between communication unit 504 and communication unit 404 through predetermined wireless communication or predetermined wired communication.

Control unit 502 calculates power by multiplying voltage and current at each predetermined time interval, and calculates an amount of power in a predetermined period by multiplying the calculated power by the predetermined period. Control unit 502 integrates amounts of power calculated until a predetermined measurement period elapses. When the predetermined measurement period has elapsed, control unit 502 transmits the integrated amount of power to server 400 via communication unit 504.

In the power system having the above-described configuration, server 400 can receive the information about the amount of power measured by smart meter 500 and can specify the amount of power exchanged between house 600 and power grid 540.

However, home appliance 602 is installed in house 600 in addition to electrically powered vehicle 1. Thus, an amount of power exchanged between battery 100 and power grid 540 in an amount of power exchanged between house 600 and power grid 540 may be unable to be measured precisely based on the information about the amount of power detected by smart meter 500.

To address such a problem, it is considered to provide smart meters for respective configurations that each exchange power in house 600; however, in such a case, cost may be increased by providing the plurality of smart meters, and server 400 may be unable to obtain a measurement result from a smart meter due to a restriction in a contract or the like.

In view of this, in the present embodiment, the power amount measurement system including electrically powered vehicle 1 (more specifically, power conversion device 70 and battery 100), server 400, and smart meter 500 is operated as follows.

That is, when a baseline indicating power consumption of home appliance 602 other than battery 100 and included in house 600 serving as a connection target of power grid 540 is in a certain state, server 400 instructs power conversion device 70 to execute first control to control power conversion device 70 to exchange power with a first amount of power being employed as an instruction value. Server 400 obtains, from smart meter 500, a first measurement result about an amount of power exchanged during an execution period of the first control. Further, when the baseline is in the certain state, server 400 instructs power conversion device 70 to execute second control to control power conversion device 70 to exchange power with a second amount of power being employed as the instruction value, the second amount of power being different from the first amount of power. Server 400 obtains, from smart meter 500, a second measurement result about an amount of power exchanged during an execution period of the second control. Server 400 determines, using the first measurement result and the second measurement result, a relation between the instruction value and a measurement value of an amount of power exchanged between power grid 540 and battery 100. In the present embodiment, server 400 determines the relation by setting, using the first measurement result and the second measurement result, a calibration line indicating the relation between the instruction value and the measurement value.

In this way, the calibration line indicating the relation between the instruction value for power conversion device 70 and the measurement value of the amount of power exchanged between power grid 540 and battery 100 is set based on the first measurement result and the second measurement result, thereby determining the relation. Hence, the amount of power exchanged between power grid 540 and battery 100 can be measured precisely without newly adding a measurement device such as a smart meter.

In the present embodiment, when the baseline is in the certain state, server 400 instructs power conversion device 70 to execute first charging control, second charging control, first power feeding control, and second power feeding control. Server 400 obtains, from smart meter 500, a measurement result about an amount of power exchanged during an execution period of each control. Further, server 400 obtains a plurality of measurement results in each control by performing the control multiple times (for example, three times). Server 400 sets the calibration line using the plurality of obtained measurement results.

Figure 3:
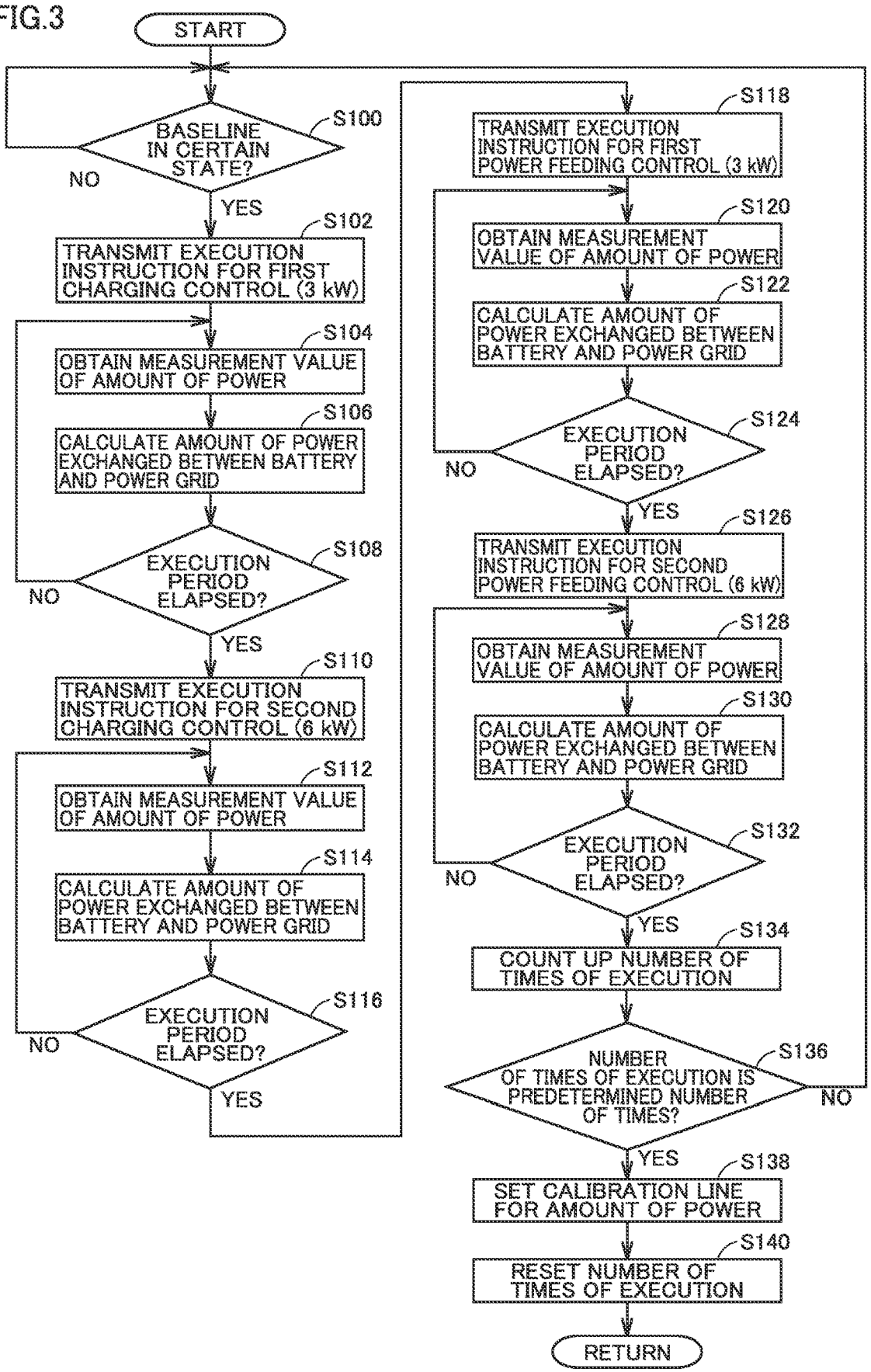
FIG. 3 is a flowchart showing an exemplary process executed by a server.

Hereinafter, a process executed by server 400 (specifically, control unit 402 of server 400) in the present embodiment will be described with reference to FIG. 3. FIG. 3 is a flowchart showing an exemplary process executed by server 400. Server 400 executes such a process when a predetermined condition is satisfied, for example. Examples of the predetermined condition include: a condition that no calibration line has been set yet; a condition that a predetermined period has elapsed since the calibration line was set previously; a condition that a current time is in a specific time period (for example, a midnight time period) in which the certain state of the baseline continues for a long time; and the like.

In a step (hereinafter, the term "step" will be abbreviated as "S") 100, server 400 determines whether or not the baseline of the power consumption of home appliance 602 in house 600 is in the certain state. Server 400 may determine that the baseline is in the certain state, for example, when a magnitude of an amount of change in the amount of power measured by smart meter 500 per predetermined period is less than or equal to a threshold value with charging and discharging of battery 100 being halted. The predetermined period and the threshold value are values set in advance in consideration of precision of the calibration line, and are fitted by experiment or the like. When it is determined that the baseline is in the certain state (YES in S100), the process proceeds to S102.

In S102, server 400 transmits an execution instruction for the first charging control to electrically powered vehicle 1. The first charging control is, for example, charging control in which charging is continuously performed for a predetermined execution period (for example, 30 minutes) using a charging power of 3 kW with an amount of charging power of 1.5 kWh being employed as an instruction value.

In S104, server 400 obtains, from smart meter 500, a measurement value of an amount of power exchanged between power grid 540 and house 600 during a period from a point of time of previous calculation to a point of time of present calculation.

In S106, server 400 calculates a measurement value of the amount of power exchanged between power grid 540 and battery 100 during the execution period of the first charging control. Server 400 calculates, for example, a measurement value (amount of change) of the amount of power exchanged between power grid 540 and battery 100 during the period from the point of time of the previous calculation to the point of time of the present calculation by subtracting an amount of power consumed by the baseline from the measurement value obtained in S104. Server 400 adds the amount of change to a measurement value (previous value) of an amount of power exchanged between power grid 540 and battery 100 until the point of time of the previous calculation, and calculates a measurement value (present value) of an amount of power exchanged between power grid 540 and battery 100 until the point of time of the present calculation.

It should be noted that each time the first charging control is executed, server 400 stores, in a distinguishable manner, an amount of power exchanged between power grid 540 and battery 100 during the execution period of the first charging control. For example, in the case where the first charging control is executed three times, server 400 stores respective amounts of power into storage unit 406 in a distinguishable manner. The same applies to the below-described second charging control, first power feeding control, and second power feeding control.

In S108, server 400 determines whether or not the execution period of the first charging control has elapsed. When it is determined that the execution period of the first charging control has elapsed (YES in S108), the process proceeds to S110. It should be noted that when it is determined that the execution period of the first charging control has not elapsed (NO in S108), the process returns to S104.

In S110, server 400 transmits an execution instruction for the second charging control to electrically powered vehicle 1. The second charging control is, for example, charging control in which charging is continuously performed for a predetermined execution period (for example, 30 minutes) with a charging power of 6 kW with an amount of power of 3.0 kWh being employed as an instruction value.

In S112, server 400 obtains, from smart meter 500, a measurement value of an amount of power exchanged between power grid 540 and house 600 during a period from a point of time of previous calculation to a point of time of present calculation.

In S114, server 400 calculates the measurement value of the amount of power exchanged between power grid 540 and battery 100 during the execution period of the second charging control. It should be noted that a calculation method is the same as the method for calculating the measurement value of the amount of power exchanged between power grid 540 and battery 100 during the execution period of the first charging control. Therefore, detailed description thereof will not be repeated.

In S116, server 400 determines whether or not the execution period of the second charging control has elapsed. When it is determined that the execution period of the second charging control has elapsed (YES in S116), the process proceeds to S118. It should be noted that when it is determined that the execution period of the second charging control has not elapsed (NO in S116), the process returns to S112.

In S118, server 400 transmits an execution instruction for the first power feeding control to electrically powered vehicle 1. The first power feeding control is, for example, power feeding control in which a feeding power of 3 kW is continuously fed for a predetermined execution period (for example, 30 minutes) with an amount of feeding power of 1.5 kWh being employed as an instruction value.

In S120, server 400 obtains, from smart meter 500, the measurement value of the amount of power exchanged between power grid 540 and house 600 during the period from the point of time of the previous calculation to the point of time of the present calculation.

In S122, server 400 calculates the measurement value of the amount of power exchanged between power grid 540 and battery 100 during the execution period of the first power feeding control. It should be noted that a calculation method is the same as the method for calculating the measurement value of the amount of power exchanged between power grid 540 and battery 100 during the execution period of the first charging control. Therefore, detailed description thereof will not be repeated.

In S124, server 400 determines whether or not the execution period of the first power feeding control has elapsed. When it is determined that the execution period of the first power feeding control has elapsed (YES in S124), the process proceeds to S126. It should be noted that when it is determined that the execution period of the first power feeding control has not elapsed (NO in S124), the process returns to S120.

In S126, server 400 transmits an execution instruction for the second power feeding control to electrically powered vehicle 1. The second power feeding control is, for example, power feeding control in which a feeding power of 6 kW is continuously fed for a predetermined execution period (for example, 30 minutes) with an amount of feeding power of 3.0 kWh being employed as an instruction value.

In S128, server 400 obtains, from smart meter 500, a measurement value of an amount of power exchanged between power grid 540 and house 600 during a period from a point of time of previous calculation to a point of time of present calculation.

In S130, server 400 calculates the measurement value of the amount of power exchanged between power grid 540 and battery 100 during the execution period of the second power feeding control. It should be noted that a calculation method is the same as the method for calculating the measurement value of the amount of power exchanged between power grid 540 and battery 100 during the execution period of the first charging control. Therefore, detailed description thereof will not be repeated.

In S132, server 400 determines whether or not the execution period of the second power feeding control has elapsed. When it is determined that the execution period of the second power feeding control has elapsed (YES in S132), the process proceeds to S134. It should be noted that when it is determined that the execution period of the second power feeding control has not elapsed (NO in S132), the process returns to S128.

In S134, server 400 counts up the number of times of execution. It should be noted that the initial value of the number of times of execution is, for example, 0. Server 400 counts up the number of times of execution by adding a predetermined value (for example, 1) to a value indicating the number of times of execution.

In S136, server 400 determines whether or not the number of times of execution is a predetermined number of times (for example, three times). When it is determined that the number of times of execution is the predetermined number of times (YES in S136), the process proceeds to S138. It should be noted that when it is determined that the number of times of execution is not the predetermined number of times (NO in S136), the process returns to S100.

In S138, server 400 sets a calibration line for amount of power. The calibration line indicates a relation between the instruction value for power conversion device 70 as to the amount of power and the measurement value of the amount of power exchanged between power grid 540 and battery 100.

Server 400 sets the calibration line using the measurement result during the execution period of the first charging control, the measurement result during the execution period of the second charging control, the measurement result during the execution period of the first power feeding control, and the measurement result during the execution period of the second power feeding control. The calibration line is represented by a linear function, for example. Specifically, the calibration line is represented by, for example, an approximation line (straight line) determined from a plurality of points plotted as measurement results on a coordinate plane set by the measurement values of the amounts of power exchanged between power grid 540 and battery 100 and the instruction values for power conversion device 70.

Figure 4:
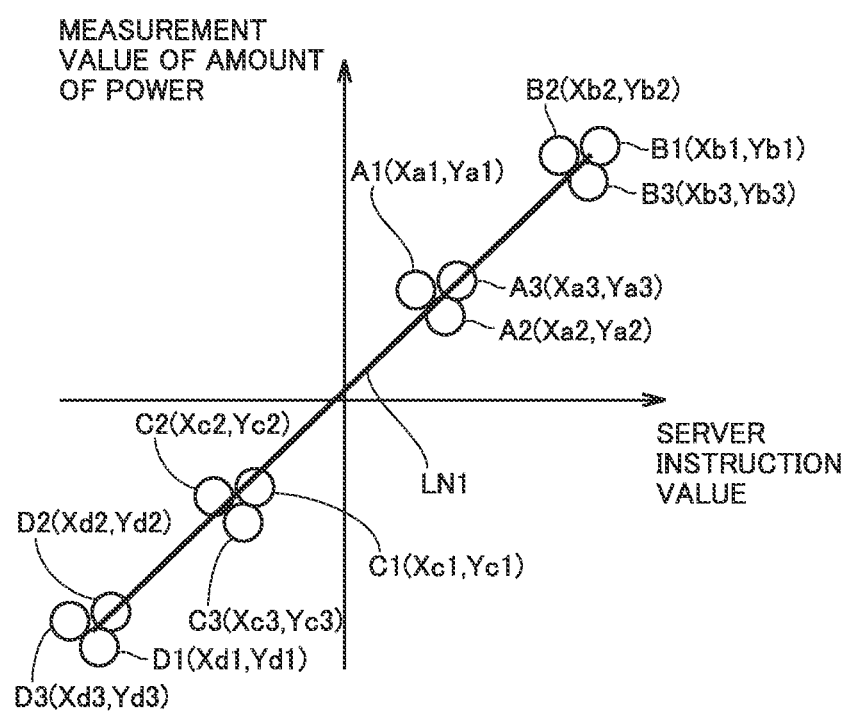
FIG. 4 is a diagram for illustrating a method for setting a calibration line.

FIG. 4 is a diagram for illustrating an exemplary method for setting the calibration line. The vertical axis of FIG. 4 represents a measurement value of the amount of power exchanged between power grid 540 and battery 100. The horizontal axis of FIG. 4 represents an instruction value (server instruction value) for the amount of power as provided from server 400 to power conversion device 70. LN1 in FIG. 4 indicates the set calibration line.

Points A1 to A3 shown in FIG. 4 indicate measurement results obtained by executing the first charging control three times. Point A1 includes Xa1 as an instruction value and Ya1 as a measurement value. Point A2 includes Xa2 as an instruction value and Ya2 as a measurement value. Point A3 includes Xa3 as an instruction value and Ya3 as a measurement value.

Points B1 to B3 shown in FIG. 4 indicate measurement results obtained by executing the second charging control three times. Point B1 includes Xb1 as an instruction value and Yb1 as a measurement value. Point B2 includes Xb2 as an instruction value and Yb2 as a measurement value. Point B3 includes Xb3 as an instruction value and Yb3 as a measurement value.

Points C1 to C3 shown in FIG. 4 indicate measurement results obtained by executing the first power feeding control three times. Point C1 includes Xc1 as an instruction value and Yc1 as a measurement value. Point C2 includes Xc2 as an instruction value and Yc2 as a measurement value. Point C3 includes Xc3 as an instruction value and Yc3 as a measurement value.

Points D1 to D3 shown in FIG. 4 indicate measurement results obtained by executing the second power feeding control three times. Point D1 includes Xd1 as an instruction value and Yd1 as a measurement value. Point D2 includes Xd2 as an instruction value and Yd2 as a measurement value. Point D3 includes Xd3 as an instruction value and Yd3 as a measurement value.

As shown in FIG. 4, from the plurality of points A1 to A3, B1 to B3, C1 to C3, and D1 to D3 each constituted of a combination of a measurement value and an instruction value, server 400 calculates a linear function indicating an approximate line to these points by using, for example, a least squares method or the like. It should be noted that a known technique may be used as a method for calculating the linear function indicating the approximate line by using the least square method. A detailed description thereof will not be provided.

In S140, server 400 resets the number of times of execution to an initial value. When it is determined that the baseline is not in the certain state (NO in S100), the process returns to S100.

An operation of the power amount measurement system based on the above-described structure and flowchart will be described.

For example, it is assumed that the baseline indicating the change in power consumption of home appliance 602 in house 600 is in the certain state. When the baseline is in the certain state (YES in S100), an execution instruction for the first charging control is transmitted from server 400 to electrically powered vehicle 1 (S102). Accordingly, battery 100 is continuously charged using a charging power of 3 kW for 30 minutes by way of an operation of power conversion device 70.

Then, a measurement value of an amount of power exchanged between power grid 540 and house 600 during a period from a point of time of previous calculation to a point of time of present calculation is obtained from smart meter 500 (S104). An amount of power consumed by the baseline is subtracted from the obtained measurement value of the amount of power so as to calculate an amount of change in the amount of power exchanged between power grid 540 and battery 100, and the calculated amount of change is added to a previous value to calculate a present value (S106). By executing such an operation until the execution period elapses, the combination of the instruction value and the measurement value corresponding to point A1 is obtained.

When the execution period of the first charging control has elapsed (YES in S108), an execution instruction for the second charging control is transmitted from server 400 to electrically powered vehicle 1 (S110). Therefore, battery 100 is continuously charged using a charging power of 6 kW for 30 minutes by way of an operation of power conversion device 70.

Then, a measurement value of an amount of power exchanged between power grid 540 and house 600 during a period from a point of time of previous calculation to a point of time of present calculation is obtained from smart meter 500 (S112). An amount of power consumed by the baseline is subtracted from the obtained measurement value of the amount of power to calculate an amount of change in the amount of power exchanged between power grid 540 and battery 100, and the calculated amount of change is added to a previous value to calculate a present value (S114). By executing such an operation until the execution period elapses, the combination of the instruction value and the measurement value corresponding to point B1 is obtained.

When the execution period of the second charging control has elapsed (YES in S116), an execution instruction for the first power feeding control is transmitted from server 400 to electrically powered vehicle 1 (S118). Therefore, power grid 540 is continuously fed with a feeding power of 3 kW from battery 100 for 30 minutes by way of an operation of power conversion device 70.

Then, a measurement value of an amount of power exchanged between power grid 540 and house 600 during a period from a point of time of previous calculation to a point of time of present calculation is obtained from smart meter 500 (S120). An amount of power consumed by the baseline is subtracted from the obtained measurement value of the amount of power to calculate an amount of change in the amount of power exchanged between power grid 540 and battery 100, and the calculated amount of change is added to a previous value to calculate a present value (S122). By executing such an operation until the execution period elapses, the combination of the instruction value and the measurement value corresponding to point C1 is obtained.

When the execution period of the first power feeding control has elapsed (YES in S124), an execution instruction for the second power feeding control is transmitted from server 400 to electrically powered vehicle 1 (S126). Therefore, power grid 540 is continuously fed with a feeding power of 6 kW from battery 100 for 30 minutes by way of an operation of power conversion device 70.

Then, a measurement value of an amount of power exchanged between power grid 540 and house 600 during a period from a point of time of previous calculation to a point of time of present calculation is obtained from smart meter 500 (S128). An amount of power consumed by the baseline is subtracted from the obtained measurement value of the amount of power to calculate an amount of change in the amount of power exchanged between power grid 540 and battery 100, and the calculated amount of change is added to a previous value to calculate a present value (S130). By executing such an operation until the execution period elapses, the combination of the instruction value and the measurement value corresponding to point D1 is obtained.

When the execution period of the second power feeding control has elapsed (YES in S132), the number of times of execution is counted up (S134). When the number of times of execution is not three (NO in S136) and the baseline is in the constant state (YES in S100), the first charging control, the second charging control, the first power feeding control, and the second power feeding control are executed again. The combinations of the instruction values and the measurement values corresponding to points A1 to A3, B1 to B3, C1 to C3, and D1 to D3 are obtained before the number of times of execution of each control becomes three.

Then, when the number of times of execution becomes three (YES in S136), a calibration line for amount of power is set (S138).

That is, as described with reference to FIG. 4, a linear function indicating an approximate line to obtained points A1 to A3, B1 to B3, C1 to C3, and D1 to D3 is set as the calibration line. Thereafter, the number of times of execution is reset to an initial value (0) (S140). It should be noted that when the baseline is not in the certain state (NO in S100), the first charging control, the second charging control, the first power feeding control, and the second power feeding control are not executed. Hence, the calibration line is not set.

With the calibration line thus set, when subsequently leveling out a power demand, server 400 may set an instruction value for electrically powered vehicle 1 (power conversion device 70) as to an amount of power based on the set calibration line and a requested amount of power to be exchanged between power grid 540 and battery 100. Alternatively, when the charging control or the power feeding control is performed for battery 100 in response to a request for leveling out a power demand, server 400 may calculate an amount of power to be exchanged between power grid 540 and battery 100 based on the instruction value as to the amount of power and the set calibration line, and may set, to the user of electrically powered vehicle 1, an incentive corresponding to the calculated amount of power.

As described above, according to the power amount measurement system of the present embodiment, the calibration line indicating the relation between the instruction value for power conversion device 70 as to the amount of power and the measurement value of the amount of power exchanged between power grid 540 and battery 100 is set based on the plurality of measurement results. Hence, the amount of power exchanged between power grid 540 and battery 100 can be measured precisely without newly adding a measurement device such as a smart meter. Accordingly, there can be provided a power amount measurement system, a power amount measurement method, and a power amount measurement device to precisely measure an amount of power exchanged between a power storage device and a power grid.

Further, since the calibration line is not set when the baseline is brought out of the certain state, a calibration line with low precision can be suppressed from being set as the calibration line.

Further, by executing the first charging control, the second charging control, the first power feeding control, and the second power feeding control multiple times, measurement results corresponding to the multiple times of execution of the first charging control, the second charging control, the first power feeding control, and the second power feeding control are obtained. Therefore, a calibration line with high precision can be set as the calibration line.

Hereinafter, modifications will be described.

In the above-described embodiment, it has been described that as the first charging control, charging is continued for 30 minutes using a charging power of 3 kW; however, the charging power and the charging period are not limited thereto as long as the charging is performed in accordance with the instruction value (for example, 1.5 kWh) for the amount of power. The same applies to the second charging control, the first power feeding control, and the second power feeding control.

Further, it has been described that each of the first charging control, the second charging control, the first power feeding control, and the second power feeding control is executed three times in the above-described embodiment; however, the number of times of execution may be one, two, or four or more, and is not particularly limited to three. Further, the number of times of execution may be different among the first charging control, the second charging control, the first power feeding control, and the second power feeding control. Moreover, for example, when it is predicted that the baseline is continuously in the certain state for a long time (for example, when the current time is in a midnight time period), the number of times of execution may be increased. When it is predicted that the baseline is not continuously in the certain state for a long time (for example, when the current time is in a daytime time period), the number of times of execution may be decreased.

Further, in the above-described embodiment, it has been illustratively described that connector 64 is attached to inlet 62 to exchange power between house 600 and battery 100; however, for example, power may be contactlessly exchanged between house 600 and battery 100.

Further, in the above-described embodiment, it has been illustratively described that electrically powered vehicle 1 is an electric vehicle; however, electrically powered vehicle 1 may be, for example, a hybrid vehicle that can be electrically driven and that includes an engine.

Further, in the above-described embodiment, it has been described that server 400 uses all of the plurality of measurement results to set the calibration line; however, for example, server 400 may set the calibration line using only a measurement result for which a difference between an instruction value and a measurement value is less than or equal to a threshold value. In this way, a measurement result including such an error that a difference between an instruction value and a measurement value is large is excluded. Hence, a calibration line with high precision can be set.

Further, in the above-described embodiment, house 600 has been illustratively described as the connection target of power grid 540; however, the connection target of power grid 540 is not limited to house 600. The connection target of power grid 540 may be a construction other than a house (for example, a building, a store, a factory, or the like).

Further, in the above-described embodiment, it has been described that the first charging control, the second charging control, the first power feeding control, and the second power feeding control are executed when the baseline is in the certain state; however, at least two of the first charging control, the second charging control, the first power feeding control, and the second power feeding control may be executed, and the calibration line may be set using at least two measurement results during the execution periods of the two of the first charging control, the second charging control, the first power feeding control, and the second power feeding control.

Further, in the above-described embodiment, it has been described that the approximate line to the plurality of points A1 to A3, B1 to B3, C1 to C3, and D1 to D3 is set as the calibration line; however, for example, a straight line passing through the origin point on the above-described coordinate plane at which the measurement value is 0 when the instruction value is 0 may be set as the calibration line. For example, for the linear function indicating the approximate line, a straight line having an intercept of 0 may be set as the calibration line. In this way, in the case where the measurement value is calculated using the calibration line, the measurement value of the amount of power exchanged between power grid 540 and battery 100 when the instruction value is 0 can be 0.

Further, in the above-described embodiment, it has been described that each of the first charging control, the second charging control, the first power feeding control, and the second power feeding control are not executed when the baseline is not in the certain state; however, for example, when the baseline is brought out of the certain state during execution of at least one of the first charging control, the second charging control, the first power feeding control, and the second power feeding control, the calibration line may not be set by aborting the control that is being executed. In this case, for example, when the baseline is brought into the certain state again, the aborted control may be executed again or the control may be executed from the first charging control again.

Further, in the above-described embodiment, the calibration line is set by server 400; however, the calibration line may be set by a below-described operation of ECU 300 of electrically powered vehicle 1.

That is, ECU 300 executes the first control when a first control execution instruction is received from server 400. The first control is executed when the baseline is in the certain state. ECU 300 obtains, from server 400, a first measurement result about an amount of power exchanged during an execution period of the first control. Further, ECU 300 executes the second control when an execution instruction for the second control is received from server 400. The second control is executed when the baseline is in the certain state. ECU 300 obtains, from server 400, a second measurement result about an amount of power exchanged during an execution period of the second control. ECU 300 sets, using the first measurement result and the second measurement result, a calibration line indicating a relation between an instruction value and an amount of power exchanged between power grid 540 and battery 100. A specific method for setting the calibration line is the same as the method described in the process of S138 of the flowchart shown in FIG. 3. Therefore, detailed description thereof will not be repeated. It should be noted that the first control includes at least one of the first charging control, the second charging control, the first power feeding control, and the second power feeding control. The second control is different from the first control, and includes at least one of the first charging control, the second charging control, the first power feeding control, and the second power feeding control.

ECU 300 calculates a measurement value of the amount of power exchanged between power grid 540 and battery 100, using the set calibration line and the instruction value for power conversion device 70 as to the amount of power.

Further, in the above-described embodiment, the calibration line is set by server 400; however, the calibration line may be set by a below-described operation of control unit 502 of smart meter 500.

That is, control unit 502 sets, using a first measurement result and a second measurement result, a calibration line indicating a relation between an instruction value and a measurement value of an amount of power exchanged between power grid 540 and battery 100, the first measurement result being a measurement result about an amount of power exchanged during an execution period of first control that is based on an execution instruction from server 400, the second measurement result being a measurement result about an amount of power exchanged during an execution period of second control that is based on an execution instruction from server 400, the first measurement result and the second measurement result being provided by measurement unit 506. A specific method for setting the calibration line is the same as the method described in the process of S138 of the flowchart shown in FIG. 3. The first control and the second control are as described above. Therefore, detailed description thereof will not be repeated.

Control unit 502 of smart meter 500 calculates the measurement value of the amount of power exchanged between power grid 540 and battery 100, using the set calibration line and the instruction value for power conversion device 70 as to the amount of power.

Further, in the above-described embodiment, the configuration shown in FIG. 1 has been described as an exemplary configuration of the power system; however, the power system is not limited to the configuration shown in FIG. 1. For example, the power system may be a configuration shown in FIG. 5.

Figure 5:
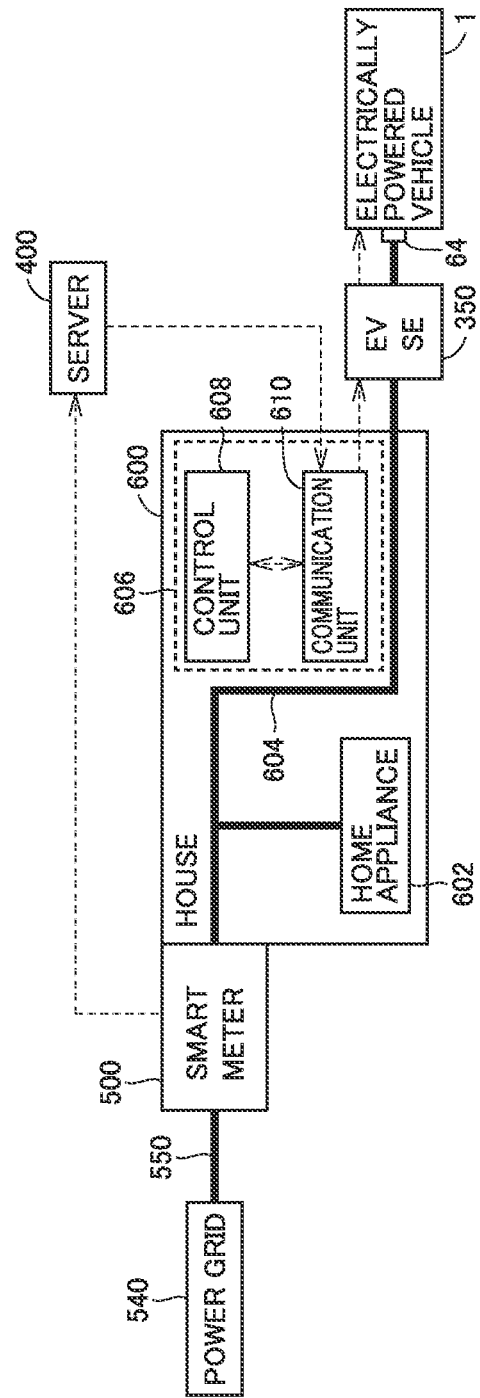
FIG. 5 is a diagram showing an exemplary configuration of a power system in a modification.

FIG. 5 is a diagram showing an exemplary configuration of a power system in a modification. The configuration of the power system shown in FIG. 5 is different from the configuration of the power system shown in FIG. 1 in that: a power management system 606 is provided in house 600; an EVSE (Electric Vehicle Supply Equipment) 350 is provided between electrically powered vehicle 1 and house 600; and an execution instruction from server 400 to electrically powered vehicle 1 is transmitted to electrically powered vehicle 1 via power management system 606 and EVSE 350.

Power management system 606 manages: power to be supplied to home appliance 602 and electrically powered vehicle 1; and power to be supplied from house 600 to power grid 540. Power management system 606 includes: a control unit 608 that executes a predetermined calculation process; and a communication unit 610 that communicates with each of EVSE 350 and server 400.

Each of the execution instructions for the first charging control, the second charging control, the first power feeding control, and the second power feeding control from server 400 is transmitted to electrically powered vehicle 1 via power management system 606 and EVSE 350. Also in such a configuration, the calibration line can be set using the measurement results of smart meter 500 in the first charging control, the second charging control, the first power feeding control, and the second power feeding control, and using the instruction values for power conversion device 70 as to the amount of power.

Further, in the above-described embodiment, it has been described that the calibration line indicating the relation between the instruction value for power conversion device 70 as to the amount of power and the measurement value of the amount of power exchanged between power grid 540 and battery 100 is set based on the plurality of measurement results; however, it is not limited to the setting of the calibration line as long as the relation between the measurement value and the instruction value is determined. For example, the relation between the measurement value and the instruction value may be determined by setting a map, a table, or the like indicating the relation between the measurement value and the instruction value.

It should be noted that a whole or part of the above-described modifications may be combined appropriately for the sake of implementation.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A power amount measurement system comprising:
a smart meter that measures an amount of power exchanged between a power grid and a connection target of the power grid;
a power storage device that is one of a plurality of electrical devices included in the connection target;
a power conversion device that adjusts power to be exchanged between the power grid and the power storage device; and
a server that obtains a measurement result of the smart meter and that controls the power conversion device, wherein
when a baseline indicating power consumption of an electrical device is in a certain state, the server instructs the power conversion device to execute first control to control the power conversion device, whereby the power conversion device exchanges power with a first amount of power being employed as an instruction value, the electrical device being other than the power storage device and included in the connection target,
the server obtains, from the smart meter, a first measurement result about an amount of power exchanged during an execution period of the first control,
when the baseline is in the certain state, the server instructs the power conversion device to execute second control to control the power conversion device, whereby the power conversion device exchanges power with a second amount of power being employed as the instruction value, the second amount of power being different from the first amount of power,
the server obtains, from the smart meter, a second measurement result about an amount of power exchanged during an execution period of the second control,
the server determines, using the first measurement result and the second measurement result, a relation between the instruction value and a measurement value of the amount of power exchanged between the power grid and the power storage device, and
the certain state is when a magnitude of an amount of change in the amount of power measured by the smart meter per predetermined period is less than or equal to a predetermined value with charging and discharging of the power storage device being halted.

2. The power amount measurement system according to claim 1, wherein the server sets, using the first measurement result and the second measurement result, a calibration line indicating the relation between the instruction value and the measurement value.

3. The power amount measurement system according to claim 2, wherein when the baseline is brought out of the certain state during execution of at least one of the first control and the second control, the server does not set the calibration line using the first measurement result and the second measurement result.

4. The power amount measurement system according to claim 1, wherein by instructing the power conversion device to execute the first control and the second control multiple times, the server obtains a plurality of measurement results about the amount of power exchanged during the execution period of the first control and the amount of power exchanged during the execution period of the second control.

5. The power amount measurement system according to claim 4, wherein the server obtains each of the first measurement result and the second measurement result using a third measurement result of the plurality of measurement results, the third measurement result indicating that a difference between the instruction value and the measurement value being less than or equal to a threshold value.

6. A power amount measurement method employing a smart meter that measures an amount of power exchanged between a power grid and a connection target of the power grid, a power storage device that is one of a plurality of electrical devices included in the connection target, and a power conversion device that adjusts power to be exchanged between the power grid and the power storage device,
the power amount measurement method comprising:
when a baseline indicating power consumption of an electrical device is in a certain state, executing first control to control the power conversion device, whereby the power conversion device exchanges power with a first amount of power being employed as an instruction value, the electrical device being other than the power storage device and included in the connection target;

obtaining, from the smart meter, a first measurement result about an amount of power exchanged during an execution period of the first control;

when the baseline is in the certain state, executing second control to control the power conversion device, whereby the power conversion device exchanges power with a second amount of power being employed as the instruction value, the second amount of power being different from the first amount of power;

obtaining, from the smart meter, a second measurement result about an amount of power exchanged during an execution period of the second control; and determining, using the first measurement result and the second measurement result, a relation between the instruction value and a measurement value of the amount of power exchanged between the power grid and the power storage device, and wherein:

the certain state is when a magnitude of an amount of change in the amount of power measured by the smart meter per predetermined period is less than or equal to a predetermined value with charging and discharging of the power storage device being halted.

7. A power amount measurement device for obtaining a measurement result of a smart meter that measures an amount of power exchanged between a power grid and a connection target of the power grid and for providing an execution instruction for predetermined control to a power conversion device that adjusts power to be exchanged between the power grid and a power storage device, the power storage device being one of a plurality of electrical devices included in the connection target, wherein when a baseline indicating power consumption of an electrical device is in a certain state, the power amount measurement device instructs the power conversion device to execute first control to control the power conversion device, whereby the power conversion device exchanges power with a first amount of power being employed as an instruction value, the electrical device being other than the power storage device and included in the connection target, the power amount measurement device obtains, from the smart meter, a first measurement result about an amount of power exchanged during an execution period of the first control, when the baseline is in the certain state, the power amount measurement device instructs the power conversion device to execute second control to control the power conversion device, whereby the power conversion device exchanges power with a second amount of power being employed as the instruction value, the second amount of power being different from the first amount of power, the power amount measurement device obtains, from the smart meter, a second measurement result about an amount of power exchanged during an execution period of the second control, the power amount measurement device determines, using the first measurement result and the second measurement result, a relation between the instruction value and a measurement value of the amount of power exchanged between the power grid and the power storage device, and the certain state is when a magnitude of an amount of change in the amount of power measured by the smart meter per predetermined period is less than or equal to a predetermined value with charging and discharging of the power storage device being halted.

8. A power amount measurement device for communicating with a server that obtains a measurement result of a smart meter that measures an amount of power exchanged between a power grid and a connection target of the power grid, the power amount measurement device comprising:

a power storage device that is one of a plurality of electrical devices included in the connection target;

a power conversion device that adjusts power to be exchanged between the power storage device and the power grid; and a controller that controls the power conversion device, wherein when a baseline indicating power consumption of an electrical device is in a certain state and the controller receives, from the server, an execution instruction for first control to control the power conversion device, whereby the power conversion device exchanges power with a first amount of power being employed as an instruction value, the controller executes the first control, the electrical device being other than the power storage device and included in the connection target, the controller obtains, from the server, a first measurement result about an amount of power exchanged during an execution period of the first control, when the baseline is in the certain state and the controller receives, from the server, an execution instruction for second control to control the power conversion device, whereby the power conversion device exchanges power with a second amount of power being employed as the instruction value, the controller executes the second control, the second amount of power being different from the first amount of power, the controller obtains, from the server, a second measurement result about an amount of power exchanged during an execution period of the second control, the controller determines, using the first measurement result and the second measurement result, a relation between the instruction value and the amount of power exchanged between the power grid and the power storage device, the controller calculates, using the relation and the instruction value, a measurement value of the amount of power exchanged between the power grid and the power storage device, and the certain state is when a magnitude of an amount of change in the amount of power measured by the smart meter per predetermined period is less than or equal to a predetermined value with charging and discharging of the power storage device being halted.

9. A power amount measurement device for communicating with a server that provides an execution instruction for predetermined control to a power conversion device that adjusts power to be exchanged between a power storage device and a power grid, the power storage device being one of a plurality of electrical devices included in a connection target of the power grid, the power amount measurement device comprising:

a measurement device that measures an amount of power exchanged between the power grid and the connection target; and a calculation device that calculates a measurement value of an amount of power exchanged between the power grid and the power storage device, wherein when a baseline indicating power consumption of an electrical device other than the power storage device and included in the connection target is in a certain state, the server instructs the power conversion device to execute first control to control the power conversion device, whereby the power conversion device exchanges power with a first amount of power being employed as an instruction value and instructs the power conversion device to execute second control to control the power conversion device, whereby the power conversion device exchanges power with a second amount of power being employed as the instruction value, the second amount of power being different from the first amount of power, the calculation device determines, using a first measurement result and a second measurement result, a relation between the instruction value and the measurement value of the amount of power exchanged between the power grid and the power storage device, the first measurement result being a measurement result about an amount of power exchanged during an execution period of the first control, the second measurement result being a measurement result about an amount of power exchanged during an execution period of the second control, the first measurement result and the second measurement result being provided by the measurement device, the calculation device calculates, using the relation and the instruction value, a measurement value of power exchanged between the power grid and the power storage device, and the certain state is when a magnitude of an amount of change in the amount of power measured by the measurement device per predetermined period is less than or equal to a predetermined value with charging and discharging of the power storage device being halted.

* * * * *